United States Patent
Yeh et al.

(10) Patent No.: US 6,429,075 B2
(45) Date of Patent: Aug. 6, 2002

(54) METHOD OF SELF-ALIGNING A FLOATING GATE TO A CONTROL GATE AND TO AN ISOLATION IN AN ELECTRICALLY ERASABLE AND PROGRAMMABLE MEMORY CELL, AND A CELL MADE THEREBY

(75) Inventors: Bing Yeh, Los Altos Hills; Yaw-Wen Hu, Cupertino, both of CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/823,032

(22) Filed: Mar. 29, 2001

Related U.S. Application Data

(62) Division of application No. 09/110,115, filed on Jul. 2, 1998.

(51) Int. Cl.[7] .......................................... H01L 21/8247
(52) U.S. Cl. ...................................... 438/260; 438/267
(58) Field of Search ................................ 438/257–267

(56) References Cited

U.S. PATENT DOCUMENTS 5,796,139 A * 8/1998 Fukase ....................... 257/315

* cited by examiner

Primary Examiner—Richard Booth
(74) Attorney, Agent, or Firm—Gray, Cary, Ware & Freidenrich

(57) ABSTRACT

An electrically programmable memory cell is of the type having a floating gate and a control gate laterally spaced apart, and both insulated from a substrate. The floating gate and the control gate are made by a self-aligned method wherein, a first layer of silicon dioxide is provided on the substrate. A first layer of polysilicon is then provided on the first layer of silicon dioxide. The first layer of polysilicon is patterned and selective portions are removed. A second layer of silicon dioxide is provided on the patterned first layer of polysilicon. Portions of the second layer of silicon dioxide are selectively masked to define regions in the corresponding first layer of polysilicon which would become the floating gate. The second layer of silicon dioxide is anisotropically etched. The second layer of silicon dioxide is then isotropically etched. The first layer of polysilicon is anisotropically etched to defined the floating gate. Exposed portion of the first layer of polysilicon are then oxidized to form a sharp edge. Silicon dioxide is deposited on the second layer of silicon dioxide and the oxidized exposed portion of the first layer of polysilicon. A second layer of polysilicon is deposited on the deposited silicon dioxide. The second layer of polysilicon is anisotropically etched to form spacers around the second layer of silicon dioxide to form the control gate.

10 Claims, 11 Drawing Sheets

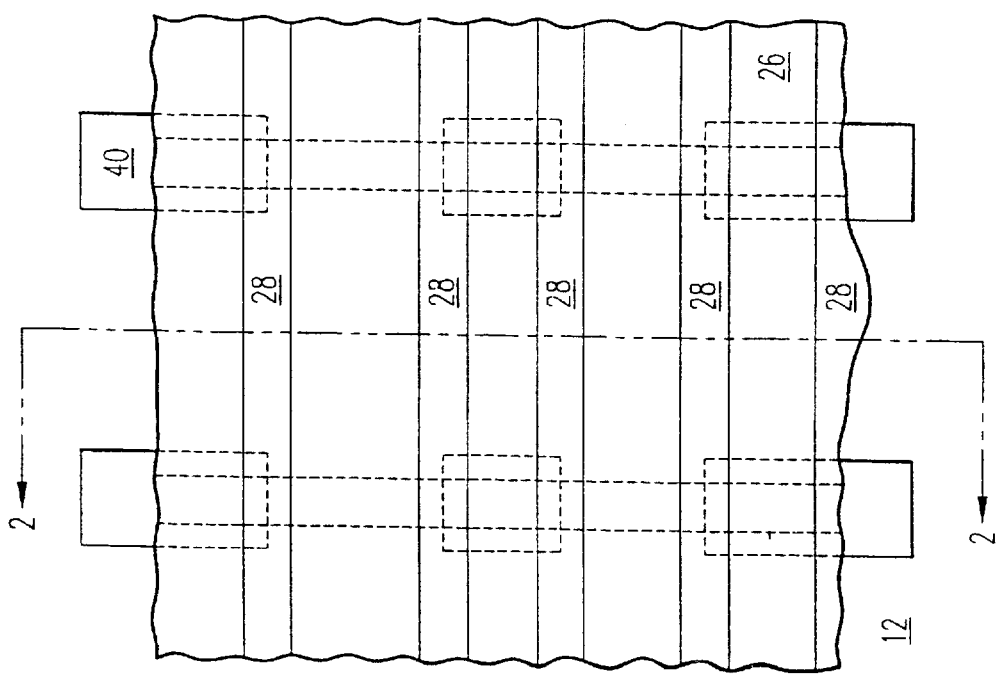
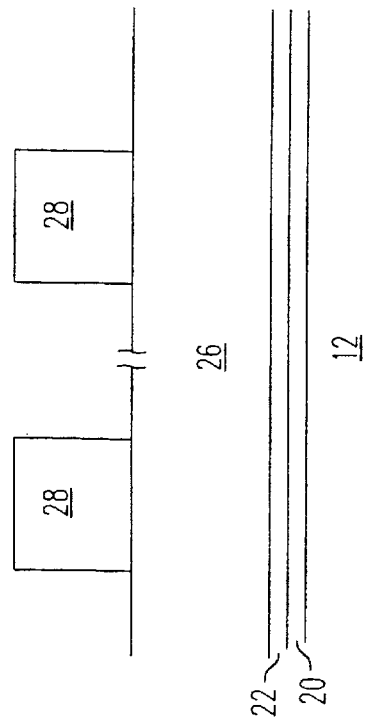
FIG. 2E-1
FIG. 2E-2

METHOD OF SELF-ALIGNING A FLOATING GATE TO A CONTROL GATE AND TO AN ISOLATION IN AN ELECTRICALLY ERASABLE AND PROGRAMMABLE MEMORY CELL, AND A CELL MADE THEREBY

This application is a division of U.S. application Ser. No. 09/110,115 filed Jul. 2, 1998.

FIELD OF THE INVENTION

The present invention relates to a method of making an electrically erasable programmable split-gate memory cell of the type having a control gate and a floating gate wherein the control gate and the floating gate are laterally spaced apart with the floating gate self-aligned to the control gate, and to an isolation in both lateral directions. The present invention further is directed to a cell made by such method.

BACKGROUND OF THE INVENTION

Electrically erasable programmable split-gate memory cells are well known in the art. One type of such cell has a first and a second spaced apart regions in a semiconductor substrate with a channel therebetween. A floating gate is insulated from the substrate and is over a first portion of the channel. A control gate is insulated from the substrate and is spaced apart from the floating gate and is over a second portion of the channel, different from the first portion. Such a cell is exemplified by U.S. Pat. No. 5,029,130. Methods for making such a type cell is also disclosed in the aforementioned patent.

One of the problems in making such electrically erasable programmable memory cells reliably and reproducibly is the alignment of the floating gate to the control gate and the floating gate to the isolation, in both lateral directions. Such alignment, if it can be accurately and precisely controlled, controls the ultimate size of the cell, which, of course, ultimately determines the density and the yield of the device.

SUMMARY OF THE INVENTION

Accordingly, in the present invention, a method of making such an electrically erasable programmable memory cell comprises the steps of providing a first layer of insulating material on a substrate. A first layer of polysilicon is provided on the first layer of the insulating material. The first layer of polysilicon is then patterned, and selective portions removed. A second layer of insulating material is provided on the first layer of polysilicon. The second layer of insulating material is selectively masked and anisotropically removed to define regions in the corresponding first layer of polysilicon which would become the floating gate. The second layer of insulating material is further isotropically etched. The first layer of polysilicon is anisotropically etched to form the floating gate from the first layer of polysilicon. The exposed portions of the first layer of polysilicon is oxidized to form a sharp edge. Silicon dioxide is then deposited on the second layer of insulating material and on the oxidized exposed portion of the first layer of polysilicon. A second layer of polysilicon is deposited on the deposited silicon dioxide. The second layer of polysilicon is anisotropically etched to form the control gate. Such a memory cell would have its control gate and its floating gate self-aligned.

DETAILED DESCRIPTION OF THE DRAWINGS

Figure 1:
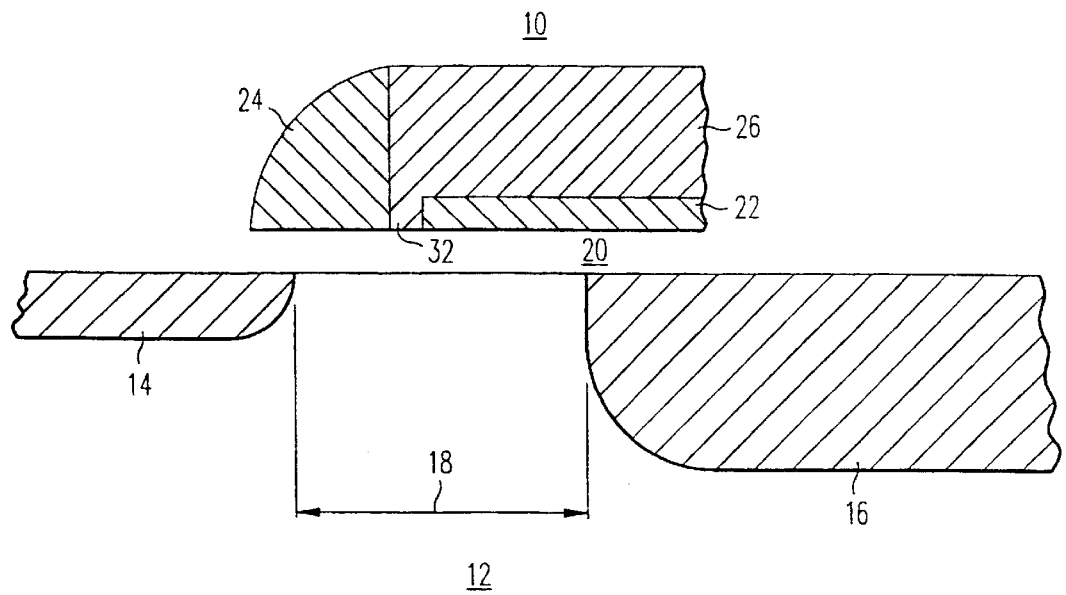
FIG. 1 is a cross-sectional view of an electrically and erasable programmable memory cell made by the method of the present invention.

Referring to FIG. 1 there is shown a cross-sectional view of the memory cell 10 of the present invention made by the process of the present invention. As described herein, the dimensions and processing recipe are for a 0.18 micron process. Clearly the invention is not limited to such process technology, and can be used in other processes.

The memory cell 10 comprises a semiconductor substrate 12 typically made of silicon. The substrate 12 has a first region 14 and a second region 16 formed therein, with a channel region 18 separating therebetween. Typically first region 14 is a drain and second region 16 is a source. Of course, the designations of the regions 14 and 16 can be reversed. A first layer 20 of insulating material is on the substrate 12. Typically, the first layer of insulating material 20 is silicon dioxide and is approximately 50 to 100 Angstroms thick. A floating gate 22, made of polysilicon, is on the first layer 20 of insulating material. The floating gate 22 is approximately 300–500 Angstroms thick. Thus, a floating gate 22 is insulated from the substrate 12 and is over a first portion of the channel 18. The floating gate 22 extends over the second region 16 in the substrate 12 and forms a capacitive coupling therewith. Finally, a control gate 24, also of polysilicon, is laterally spaced apart from the floating gate 22 and is on the first layer 20 of insulating material. Thus, a control gate 24 is also insulated from the substrate 12 and is over a second portion of the channel 18. The floating gate 22 and the control gate 24 are spaced apart from one another, separated by a second layer 32 of insulating material, typically also of silicon dioxide.

One of the critical problems in making a reliably reproducible memory cell 10 is the alignment of the control gate 24 with the floating gate 22. In addition, another critical problem is the alignment of the floating gate 22 with the isolation regions, in both lateral directions. As will be seen, with the method of the present invention, all of these critical alignment issues can be solved by using the method of the present invention which is a self-aligning process. As previously discussed, the operation of the cell 10 is generally well known and can be found in U.S. Pat. Nos. 5,029,130 and 5,572,054, which are incorporated herein by reference.

Figure 2L:
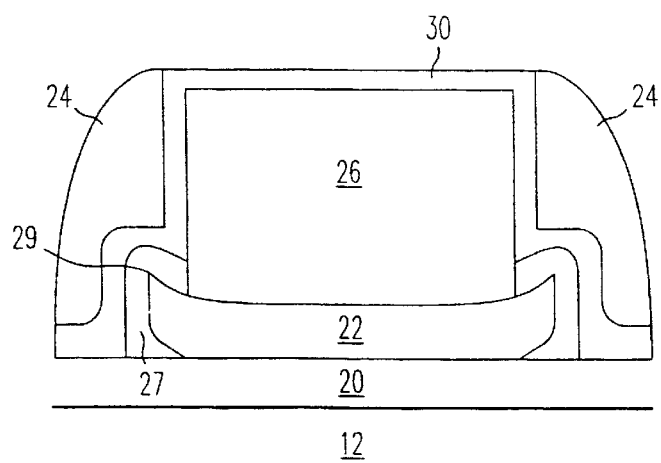
FIGS. 2(a–m) are various views showing the steps in the method of making an array of memory cells of the type shown in FIG. 1, in a semiconductor substrate.
Figures 2, 2A:
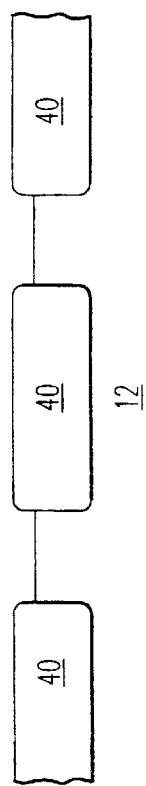
Figures 1, 2A:
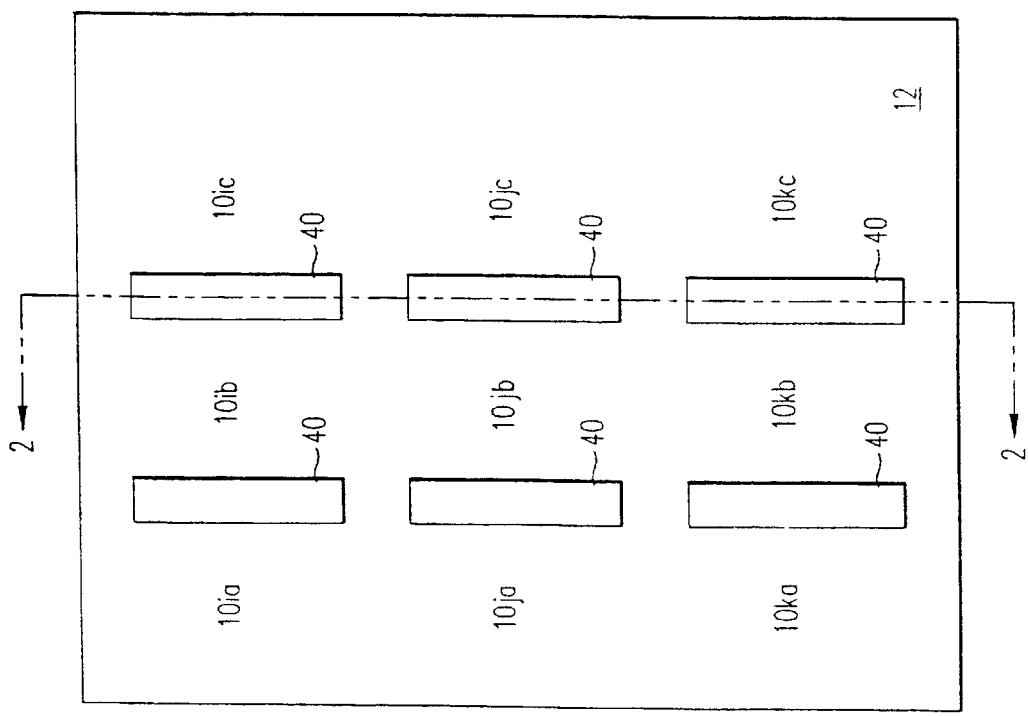

The method of forming the memory cell 10 in an array form in a substrate 12 begins by forming isolation regions 40 in the substrate 12. The isolation regions 40 separate one memory cell 10 from another in the same row (i) as shown in FIG. 2a-1. The isolation regions 40, however, are not continuous in the bit line direction. There is a discontinuity in the column or bit line direction permitting a common source line 16, which will be explained in greater detail hereinafter, to run parallel in the word line direction. The common source lines 16 serve to separate memory cells 10 in the same column (e.g. memory cells 10b in the same column) from one another. A cross sectional view taken along the line 2—2 is shown in FIG. 2a-2. The isolation regions 40 can be made by well known LOCOS process or shallow trench process. For the purpose of discussion of this invention, the isolation regions 40 are shallow trench.

Figures 2, 2B:
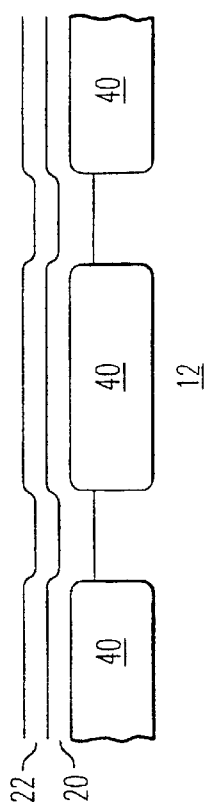
Figures 2, 2B, 3:
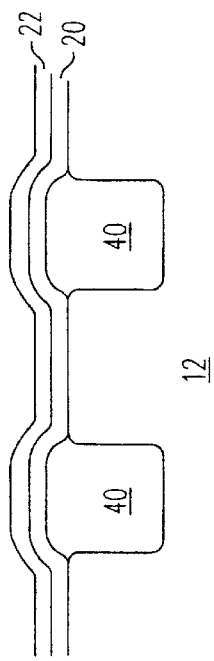
Figures 1, 2B:
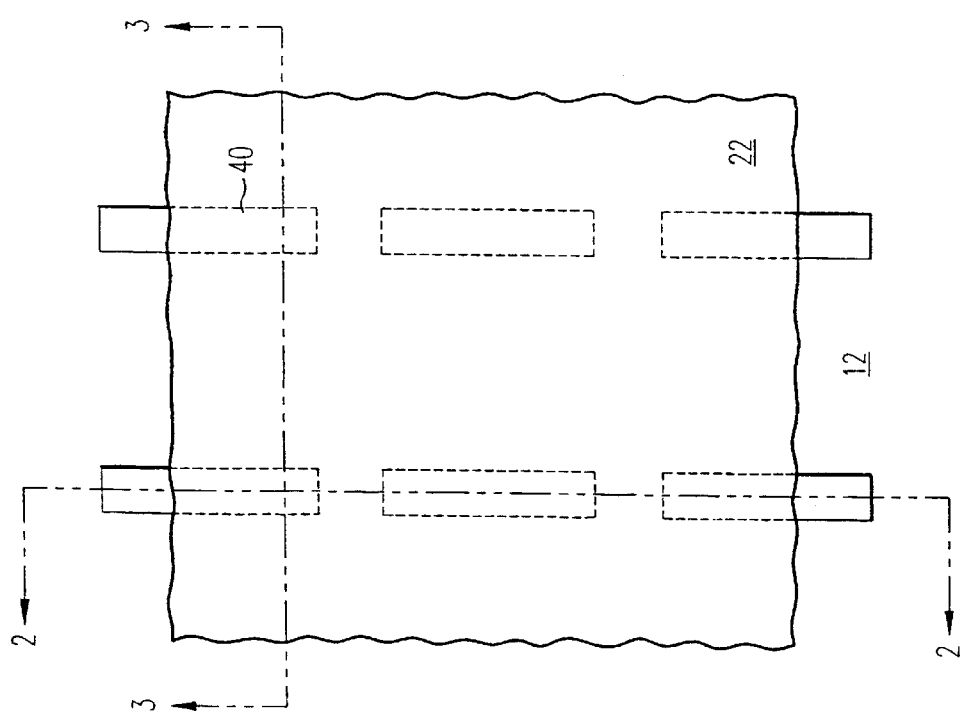

Referring to FIG. 2b-1 there is shown a top view of the substrate 12 in the next steps in the method of the present invention. After the isolation regions 40 are formed, a first layer 20 of silicon dioxide is formed on the substrate 12. The first layer 20 of silicon dioxide is formed by thermal oxidation and results in approximately 80 Angstrom in thickness. Thereafter, a first layer of polysilicon 22 is formed on the first layer 20 of silicon dioxide. The polysilicon 22 is formed by Low Pressure Chemical Vapor Deposition (LPCVD) and results in a layer of approximately 500 Angstroms in thickness. FIGS. 2b-2 and 2b-3 are cross sectional views of FIG. 2b-1 taken along the lines 2—2 and 3—3 respectively.

Figures 2, 2C:
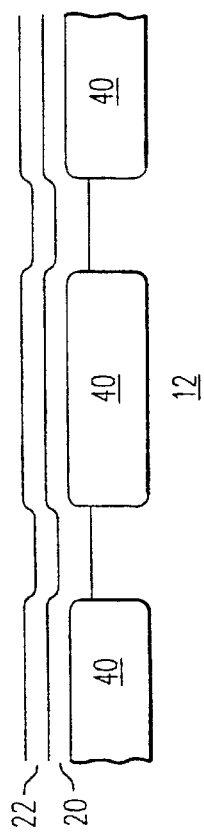
Figures 2, 2C, 3:
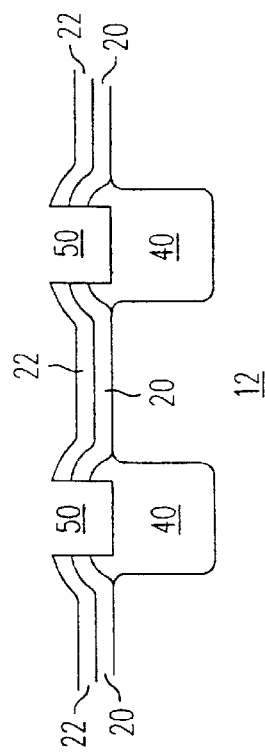
Figures 1, 2C:
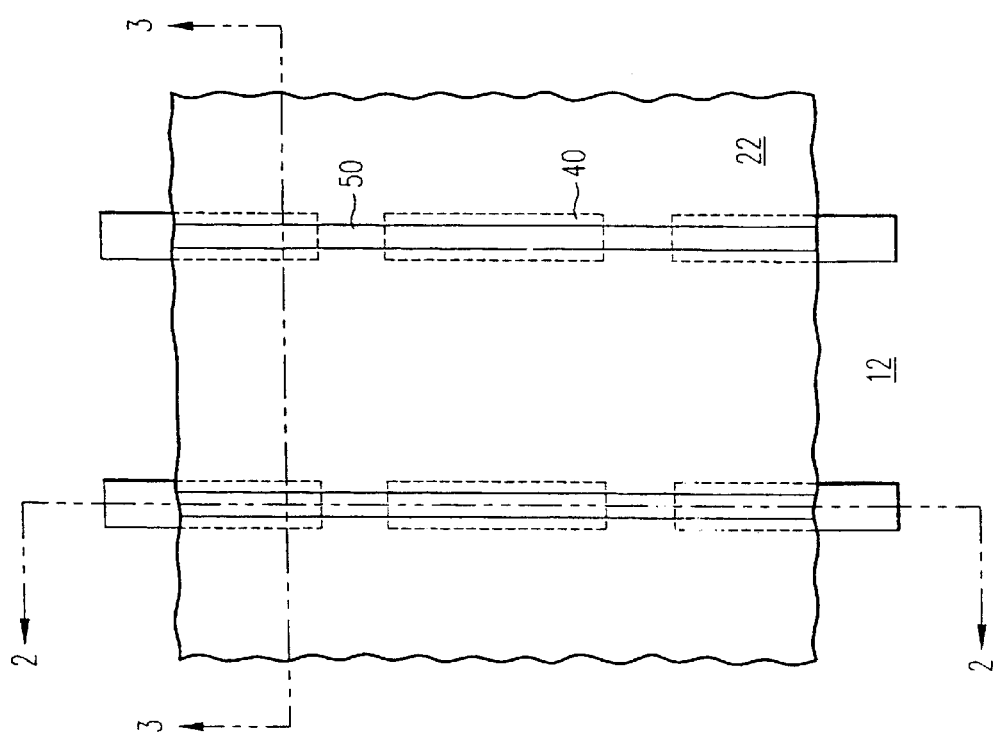

Referring to FIG. 2c-1, there is shown a top view of the substrate 12 in the next step in the method of the present invention. A cross sectional view of FIG. 2c-1 taken along the lines 2—2 and 3—3 are shown in FIGS. 2c-2 and 2c-3 respectively. The polysilicon 22 is patterned and portions 50, parallel to the isolation regions 40, between adjacent memory cells 10 in the word line direction are removed. Thus, a floating gate 22 (formed from the polysilicon 22) is isolated from an adjacent floating gate 22 in an adjacent bit line (or an adjacent column) in the same word line. The slots 50 have a width which is smaller or narrower than the width of the isolation regions 40. This assures that in the event of mis-alignment, the first polysilicon layer 22 would always fill the region between adjacent isolation regions 40 in a "row" direction.

Figures 2, 2D:
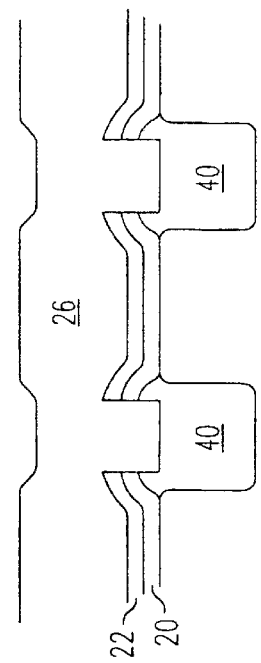
Figures 2, 2D, 3:
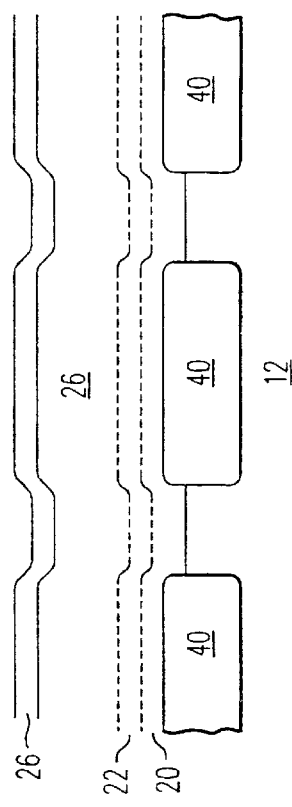
Figures 1, 2D:
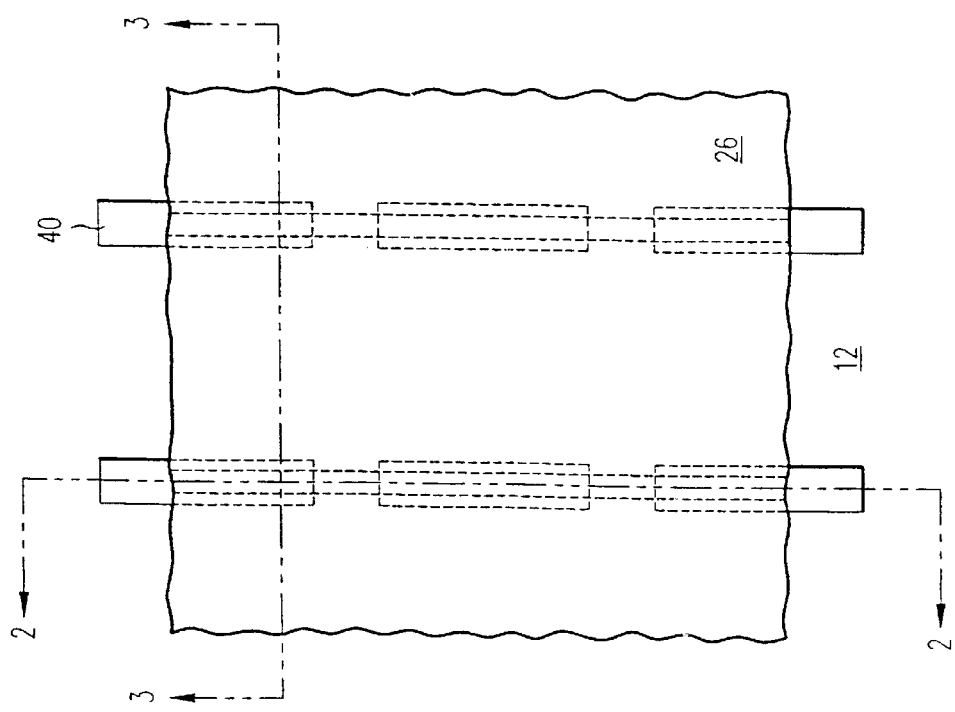

A second layer 26 of silicon dioxide is formed everywhere. The result is shown in FIG. 2d-1, with cross sectional views along the lines 2—2 and 3—3 shown in FIGS. 2d-2 and 2d-3, respectively. The second layer 26 of silicon dioxide is formed by LPCVD and results in a layer of silicon dioxide of approximately 2,000 Angstrom in thickness. The second layer 26 of silicon dioxide fills the slots 50 which separate the floating gates 22 in the row direction. By filling the slots 50 with the insulating layer 26, the floating gate 22 is self-aligned to the isolation regions 50 in the row direction.

Appropriate photoresist 28 is applied to the second layer 26 of silicon dioxide, and is then masked and patterned. The photoresist 28 masks selective portions of the second layer 26 of the silicon dioxide. This is shown in FIG. 2e-1 with a cross sectional view taken along the line 2—2 shown in FIG. 2e-2. The photoresist 28 remain in stripes parallel to the word line direction and have portions crossing over the isolation regions 40 and portions over the region between the isolation regions 40 to define regions in the second layer 26 and the first layer 22 such that the region of polysilicon in the first layer 22 so defined will form the floating gate 22.

Figure 2F:
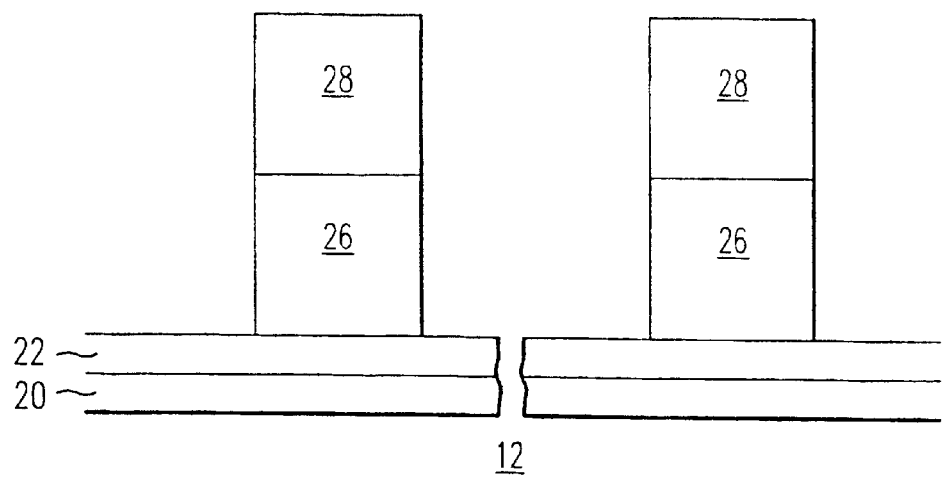

The second layer 26 of silicon dioxide is anisotropically etched. The anisotropic etch proceeds through the second layer 26 of silicon dioxide until the first layer 22 of polysilicon. This is shown in FIG. 2f, which is the cross sectional view along the line 2—2 of FIG. 2e-1 after the anisotropic etch. This results in rows of interconnected second layer 26 of silicon dioxide, in which within each row the oxide layer 26 is continuous and interconnected, but with the rows of oxide 26 separated from one another.

Figure 2G:
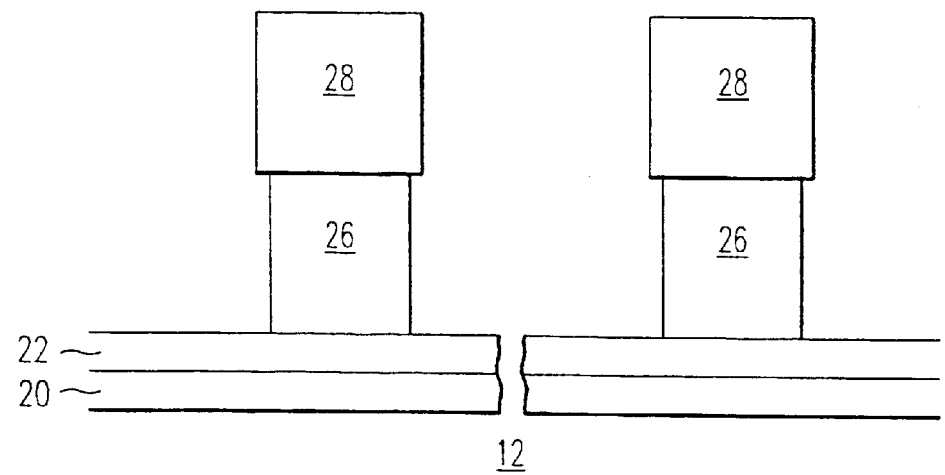

After the second layer 26 of silicon dioxide is anisotropically etched, the second layer 26 of silicon dioxide is then isotropically etched. By isotropically etching the second layer 26 of silicon dioxide, further portions of the first layer 22 of polysilicon are exposed. This is shown in FIG. 2g, which is the cross sectional view along the line 2—2 of FIG. 2e-1 after the anisotropic etch and the isotropic etch. The isotropic etch results in portions of the second layer 26 of silicon dioxide being removed beneath the photoresist 28, under the photoresist overhang.

Using the same photoresist 28, the polysilicon 22 is anisotropically etched, and then the photoresist 28 is removed. The resultant area of the first layer 22 of polysilicon 22 not etched forms the floating gate. This is shown greatly exaggerated in FIG. 2h-1, with cross-sectional views taken along the lines 2—2 and 3—3 shown in FIGS. 2h-2 and 2h-3, respectively.

Figures 2, 2H:
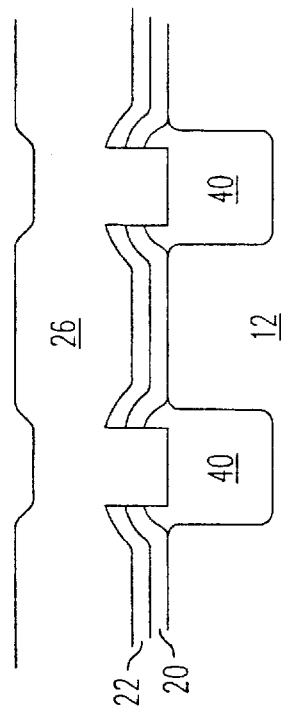
Figures 2, 2H, 3:
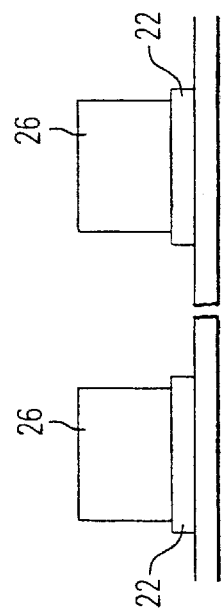
Figures 1, 2H:
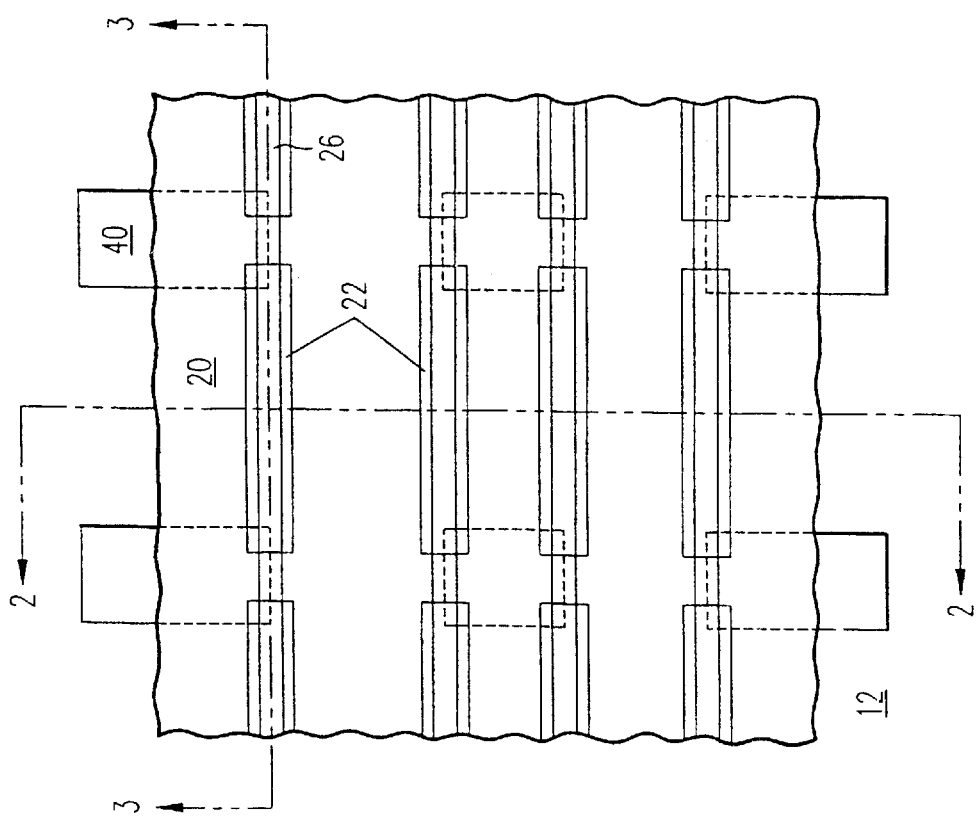
Figure 2I:
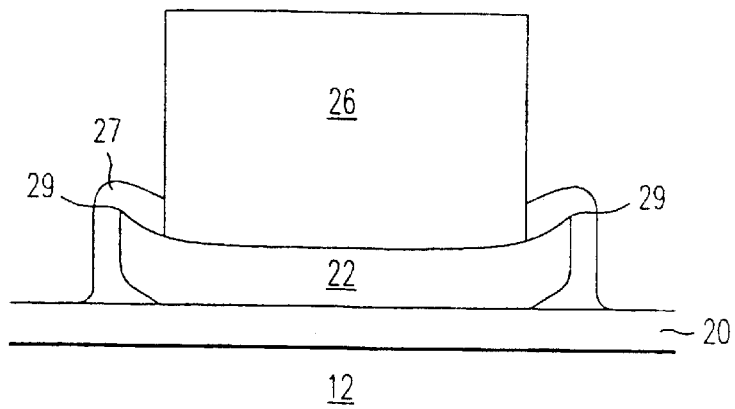

As can be seen in FIG. 2h-2, due to the isotropic etching step, a portion of the first layer 22 is not covered by the second insulating material 26 and is exposed. The first layer 22 is then oxidized. This can be done by exposing the structure shown in FIG. 2h-1 in a diluted steam oxygen atmosphere at low temperature (e.g. 800–900 degrees Celsius) for an amount of time sufficient to grow approximately 50–70 Angstroms of silicon dioxide 27 from the exposed first layer 22 of polysilicon. The oxidation of the exposed portion of the polysilicon 22 results in the exposed portion of polysilicon 22 being converted into silicon dioxide 27. Further, the exposed portion 27 of the polysilicon 22 leaves the unexposed portion of the polysilicon 22 forming a sharp edge 29. This is shown in FIG. 2i, in which only a portion of the cross sectional view along the line 2—2 of FIG. 2h-1 is shown. Hereinafter, unless otherwise indicated only a portion, i.e. a single memory cell 10, will be shown in the drawings.

Figure 2J:
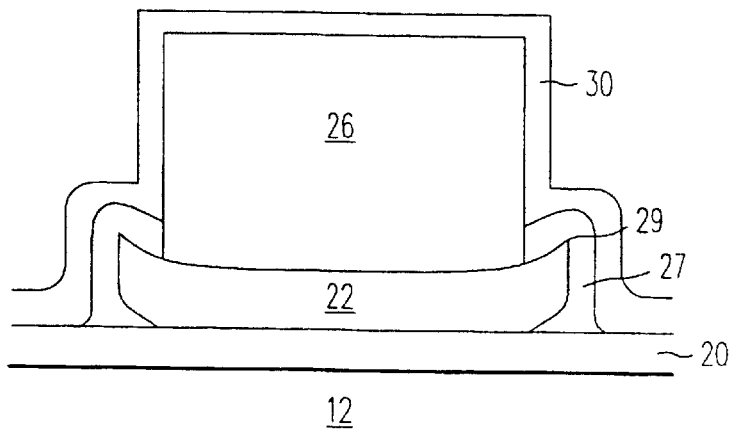

Thereafter, silicon dioxide 30 is then deposited over the second layer 26 of insulating material and over the exposed portion 27 of the floating gate 22 which has been oxidized and over the first layer 20 of insulating material. Although the second layer 26 of insulating material, the oxidized portion 27 of the floating gate 22, and the first layer 20 of insulating material are all the same, namely silicon dioxide, the resultant structure is shown in FIG. 2j with "different" layers. This is shown for explanatory purpose only. The amount of deposition and time to produce the structure shown in FIG. 2j is approximately 800 degrees celsius, for a sufficient amount of time to deposit approximately 70–150 Angstroms of silicon dioxide 30.

Figure 2K:
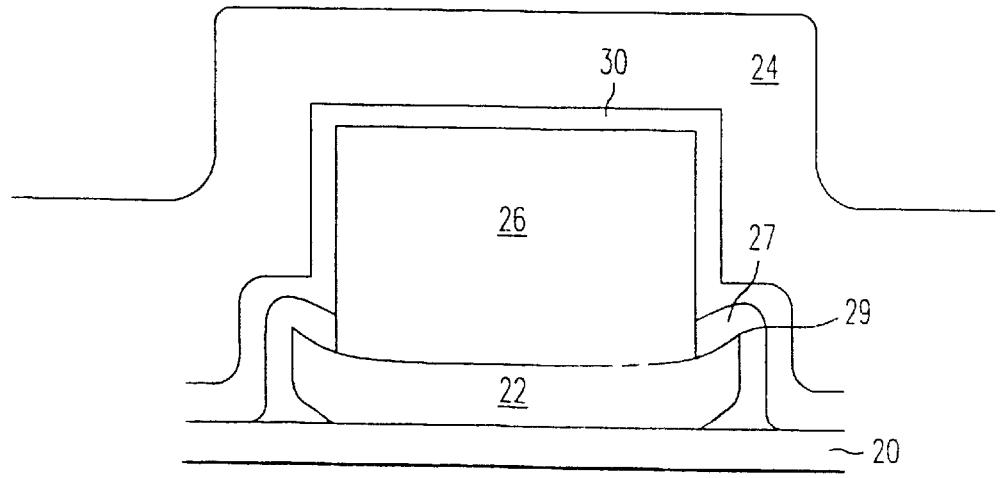
Figures 1, 2M:
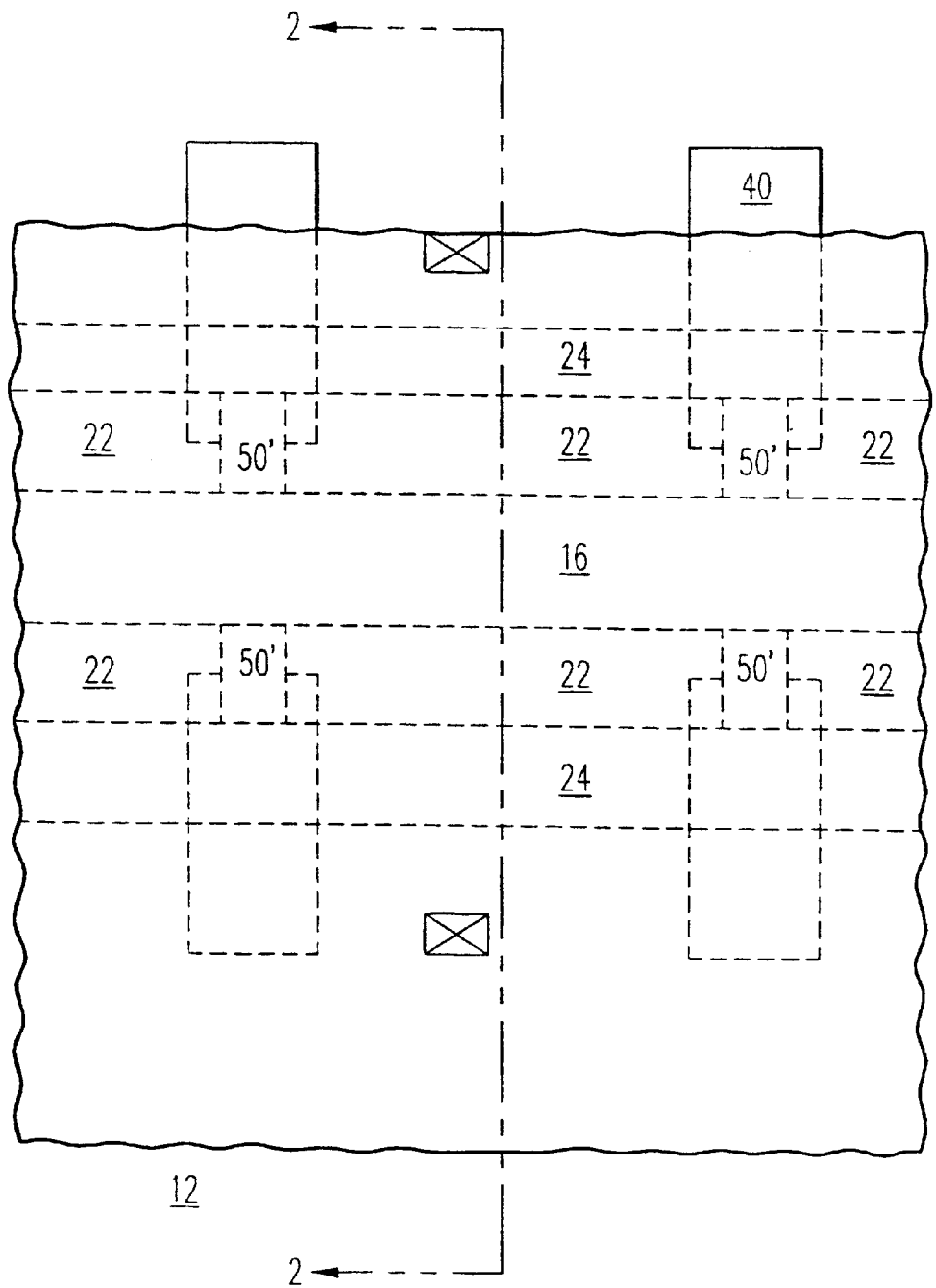
Figures 2, 2M:
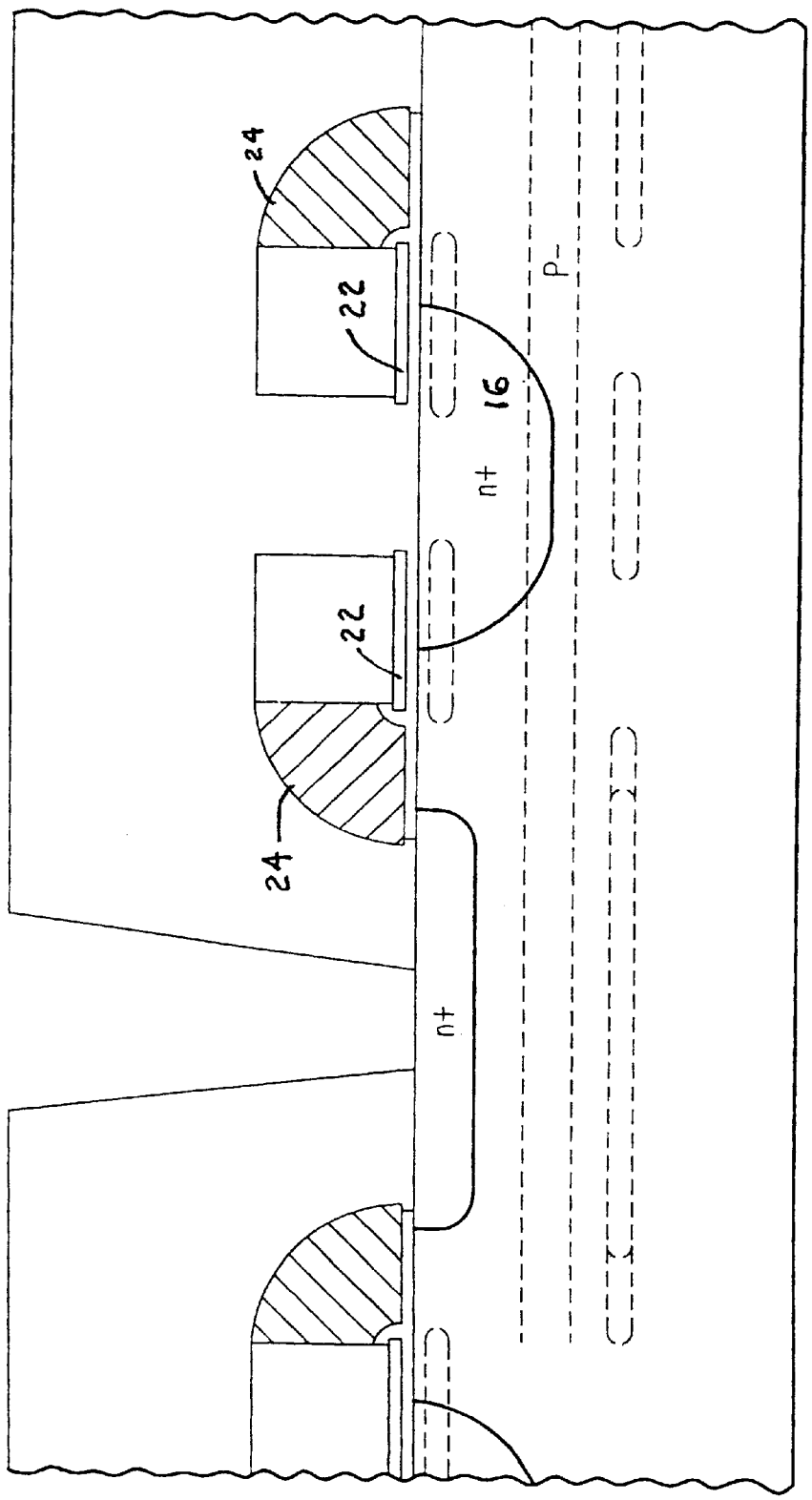

A second layer 24 of polysilicon is then deposited on the structure shown in FIG. 2j. The second layer 24 is formed by LPCVD. As a result, the second layer 24 of polysilicon covers the layer 30 of silicon dioxide, as well as the first layer 20 of insulating material. The resultant structure is shown in FIG. 2k. The second layer 24 of polysilicon is then anisotropically etched. The second layer 24 is etched until all of the portion deposited directly "on top" of the silicon dioxide 30 is removed. This leaves a sidewall 24 or a spacer 24 and forms the control gate 24, and is shown in FIG. 2-I. Since the anisotropic etch results in a spacer or control gate 24 on both sides of the silicon dioxide 30, one of the spacers 24 or control gate 24 is subsequently removed. Thus, within each row, the control gate 24 is interconnected polysilicon 24, but the interconnected polysilicon 24 are separated from one another in different rows. The floating gate 22 is then self-aligned with the control gate 24 in the column or bit line direction. This self alignment of the floating gate 22 with the control gate 24 also self-aligns the floating gate 22 with the isolation regions 50' in the column or bit line direction.

A first implant consisting of Boron is made over the entire structure. Where the common conduction line 16 is exposed, i.e. in those regions where the second layer 26 of insulating material and the first layer 22 of the first polysilicon are removed, the implant is much deeper (approximately 2000–3000 Angstroms) than those regions where the second layer 26 of silicon dioxide and the first layer 22 of polysilicon still remain (approximately close to the surface). This deep implant suppresses the punch through between adjacent memory cells 10 in the same column, A second implant is directed to only the common source region 16. Finally, a third implant is directed to the common source regions 16 and the drain regions 14. Thus, the implant process is also a self-aligned process.

As can be seen from the foregoing, with the method of the present invention, the size of the control gate 24 is determined by the thickness of the layer 24, and the size of the memory cells 10 sharing the same source regions 16 are mirror images of one another. Furthermore, as can be seen from the resultant structure shown in FIG. 2I, the control gate 24 need not have a portion that overlies the floating gate 22. The control gate 24 can be simply adjacent to and spaced apart from the floating gate 22. Of course, depending upon the isotropic etch step of FIG. 2g, and the deposition of silicon dioxide step of 2j, the structure of the memory cell 10 can be made such that the control gate 24 has a portion which overlies the floating gate 22. Such structure would then be similar to the structure disclosed in U.S. Pat. No. 5,029,130.

What is claimed is:

1. A method of making an array of electrically erasable programmable memory cells arranged in a plurality of rows and columns, each memory cell of the type having a first and a second spaced apart regions in a substrate with a channel therebetween, a floating gate insulated from said substrate and over a first portion of said channel, and a control gate insulated from said substrate, spaced apart from said floating gate and over a second portion of said channel, different from said first portion, said method for making said floating gate and control gate comprising:

providing a first layer of insulating material on said substrate;

providing a first layer of polysilicon on said first layer of insulating material;

providing a second layer of insulating material on said first layer of polysilicon;

patterning and selectively removing portions of said second layer of insulating material and said first layer of polysilicon, to form a plurality of spaced apart floating gates, arranged in said plurality of rows and columns, and a plurality of rows of spaced apart second layer of insulating material, each row of second layer of insulating material extending continuously in a row direction and positioned on said spaced apart floating gates arranged in said row direction;

providing a plurality of rows of spaced apart third layer of insulating material, each row of third layer of insulating material extending continuously in said row direction and is immediately laterally adjacent to said floating gates in said row direction and to a corresponding row of second layer of insulating material; and forming a plurality of rows of spaced apart spacers, each row of spaced apart spacers extending continuously in said row direction and positioned on said first layer of insulating material and is immediately laterally adjacent to said row of third layer of insulating material;

wherein a portion of each row of spaced apart spacer positioned over the channel being a control gate for the corresponding memory cell.

2. The method of claim 1 wherein said patterning and selectively removing step further comprises:

selectively masking portions of said second layer of insulating material to define regions in said corresponding first layer of polysilicon which would become said floating gate;

anisotropically etching said second layer of insulating material;

isotropically etching said second layer of insulating material; and anistropically etching said first layer of polysilicon to form said floating gate from said first layer of polysilicon.

3. The method of claim 2 further comprising the step of oxidizing exposed portions of said first layer of polysilicon to form a sharp edge.

4. The method of claim 3 wherein said step of providing a plurality of rows of spaced apart third layer of insulating material further comprises:

depositing a third layer of insulating material on said second layer of insulating material and said oxidized exposed portions of said first layer of polysilicon.

5. The method of claim 4 wherein said step of forming a plurality of rows of spaced apart spacers further comprises:

depositing a second layer of polysilicon on said third layer of insulating material;

anisotropically etching said second layer of polysilicon.

6. A method of making an array of electrically erasable programmable memory cells arranged in a plurality of rows and columns, each memory cell of the type having a first and a second spaced apart regions in a substrate with a channel therebetween, a floating gate insulated from said substrate and over a first portion of said channel, and a control gate insulated from said substrate, spaced apart from said floating gate and over a second portion of said channel, different from said first portion, said method for making said floating gate and control gate comprising:

providing a first layer of insulating material on said substrate;

providing a first layer of polysilicon on said first layer of insulating material;

providing a second layer of insulating material on said first layer of polysilicon;

patterning and selectively removing portions of said second layer of insulating material and said first layer of polysilicon, to form a plurality of spaced apart floating gates, arranged in said plurality of rows and columns, and a plurality of rows spaced apart second layer of insulating material, each row of second layer of insulating material extending continuously in a row direction and positioned on said spaced apart floating gates arranged in said row direction;

providing a plurality of rows spaced apart third layer of insulating material, each row of third layer of insulating material extending continuously in said row direction and is immediatly laterally adjacent to said floating gates in said row direction and to a corresponding row of second layer of insulating material; and forming a plurality of rows of spaced apart spacers, each row of spaced apart spacers extending continuously in said row direction and positioned on said first layer of insulating material and is immediatly laterally adjacent to said row of third layer of insulating material;

wherein a portion of each row of spaced apart spacer positioned over the channel being a control gate for the corresponding memory cell.

7. The method of claim 6 wherein said patterning and selectively removing step further comprises:

selectively masking portions of said second layer of insulating material to define regions in said corresponding first layer of polysilicon which would become said floating gate;

anisotropically etching said second layer of insulating material;

isotropically etching said second layer of insulating material; and anistropically etching said first layer of polysilicon to form said floating gate from said first layer of polysilicon.

8. The method of claim 7 further comprising the step of oxidizing exposed portions of said first layer of polysilicon to form a sharp edge.

9. The method according to claim 8 wherein said step of providing a plurality of rows of spaced apart third layer of insulating material further comprises:

depositing a third layer of insulating material on said second layer of insulating material and said oxidized exposed portions of said first layer of polysilicon.

10. The method of claim 9 wherein said step of forming a plurality of rows of spaced apart spacers further comprises:

depositing a second layer of polysilicon on said third layer of insulating material;

anisotropically etching said second layer of polysilicon.

* * * * *